(12) United States Patent
Chen

(10) Patent No.: US 6,933,791 B2
(45) Date of Patent: Aug. 23, 2005

(54) FREQUENCY SYNTHESIZING CIRCUIT HAVING A FREQUENCY MULTIPLIER FOR AN OUTPUT PLL REFERENCE SIGNAL

(75) Inventor: Wei-Zen Chen, Hsinchu (TW)

(73) Assignee: National Central University, Jhongli (TW)

( * ) Notice: Subject to any disclaimer, the term of this patent is extended or adjusted under 35 U.S.C. 154(b) by 0 days.

(21) Appl. No.: 10/613,316

(22) Filed: Jul. 7, 2003

(65) Prior Publication Data

US 2005/0007203 A1 Jan. 13, 2005

(51) Int. Cl.$^7$ ................................................ H03L 7/06
(52) U.S. Cl. ........................... 331/45; 331/2; 327/147
(58) Field of Search ........................... 331/45, 210, 46, 331/50, 53; 327/147, 156

(56) References Cited

U.S. PATENT DOCUMENTS

| | | | | |
|---|---|---|---|---|
| 5,889,436 A | * | 3/1999 | Yeung et al. | 331/2 |
| 6,107,891 A | * | 8/2000 | Coy | 331/18 |
| 6,759,911 B2 | * | 7/2004 | Gomm et al. | 331/10 |
| 2002/0033736 A1 | * | 3/2002 | Heymann | 331/2 |

* cited by examiner

*Primary Examiner*—Benny Lee
*Assistant Examiner*—Joseph Chang
(74) *Attorney, Agent, or Firm*—Apex Juris, pllc; Tracy M Heims

(57) ABSTRACT

A frequency synthesizing circuit is provided. The frequency synthesizing circuit includes a frequency multiplying circuit and a phase-locked loop, wherein the frequency multiplying circuit can converts a reference signal having a low frequency into a high frequency signal for being a reference signal of the phase-locked loop, so that the loop bandwidth of the phase-locked loop can be increased to reduce jitter of the output signal. The present invention utilizes the delay-locked loop to generate multiphase output signals that equivalently divide a cycle of the reference signal for achieving a frequency multiplying through cooperating with a phase synthesizer. Through double frequency multiplying functions of the delay loop and the phase locked loop, a phase error accumulation caused by the single frequency multiplying of the conventional phase-locked loop with narrow loop bandwidth can be reduced. Furthermore, the frequency multiplying can be adjusted by synthesizing different phases of delay-locked loop and the divider coefficient of the phase-locked loop.

3 Claims, 4 Drawing Sheets

Prior Art

US 6,933,791 B2

FREQUENCY SYNTHESIZING CIRCUIT HAVING A FREQUENCY MULTIPLIER FOR AN OUTPUT PLL REFERENCE SIGNAL

BACKGROUND OF THE INVENTION

1. Field of the Invention

The present invention relates to a frequency synthesizing circuit, and particularly to a frequency synthesizer which has a low frequency reference signal, a high frequency output, and a high multiple for frequency synthesizing.

2. Description of the Prior Art

Phase-Locked Loop (PLL) is a technique usually used in a frequency synthesizing circuit, as shown in FIG. 1. The basic framework thereof includes a phase-frequency detector (PFD) 14, a charge pump loop filter (CPF) 16, a voltage control oscillator (VCO) 18 and a divider 20. Through the function of the PFD, the output frequency of the VCO can be adjusted accordingly. When the loop is phase locked, the output frequency ($f_{vco}$) of the VCO and the frequency ($f_{ref}$) of the reference signal will satisfy the formula of $f_{vco}=N \times f_{ref}$, wherein N is a coefficient of the divider.

For an application of a high frequency generator (>100 MHz) with a low reference frequency (<100 kHz), such as in a receiver of a video transmission system, a high frequency clock generated from a screen horizontal synchronous signal (HSYNC) is required for an analog to digital converter. In a traditional PLL, a high-ratio divider (N) is required for frequency multiplication. But it often accumulates an extremely large amount of phase errors. In addition, for a low frequency reference signal, the PLL loop bandwidth should be narrowed down which may result in higher phase noise introduced by VCO.

Thus it can be seen, the prior art described above still has some defects, is not a good design, however, and is urgently to be improved.

Because of the technical defects of described above, the applicant keeps on carving unflaggingly to develop the frequency synthesizing circuit through wholehearted experience and research.

SUMMARY OF THE INVENTION

An object of the present invention is to provide a frequency synthesizing circuit which achieves double frequency multiplication by means of a phase-locked loop incorporated with a delay-locked loop so as to minimize phase error accumulations.

Another object of the present invention is to be applied in a programmable frequency synthesizer, especially for those have a low frequency reference signal (~kHz) while to generate a high frequency output (>100 MHz).

For achieving the purposes described above, the frequency synthesizer according to the present invention includes a frequency multiplier and a phase-locked loop, wherein the frequency multiplier converts a low frequency reference signal into a high frequency signal for being a reference signal to the phase-locked loop, so that the loop bandwidth of the phase-locked loop can be increased to reduce output jitter.

Here, the frequency multiplier consists of a delayed locked loop and a phase synthesizer. The delay-locked loop is utilized to generate multi-phase output signals that equivalently divides a cycle of the reference signal. And the multiplication of reference signal is accomplished by synthesizing different output phases of the delay-locked loop, which is controlled by the coefficient of the frequency multiplier. Through double frequency multiplication achieved by the delay-locked loop incorporated with the phase locked loop, the accumulated phase error can be reduced compared to that in a conventional phase-locked loop due to a wider loop bandwidth can be applied. Herein, frequency multiplied can be accomplished by adjusting the coefficients of frequency multiplier or the divider of the phase-locked loop.

BRIEF DESCRIPTION OF THE DRAWINGS

The drawings disclose an illustrative embodiment of the present invention which serves to exemplify the various advantages and objects hereof, and are as follows.

multiplying phase synthesizer which is achieved by n phases signals that equivalently divides a cycle.

DETAILED DESCRIPTION OF THE PREFERRED EMBODIMENT

Figure 1:
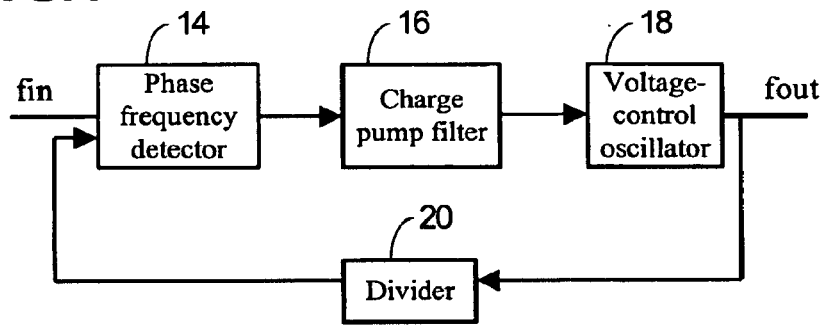
FIG. 1 shows a framework of a conventional frequency synthesizer.
Figure 2:
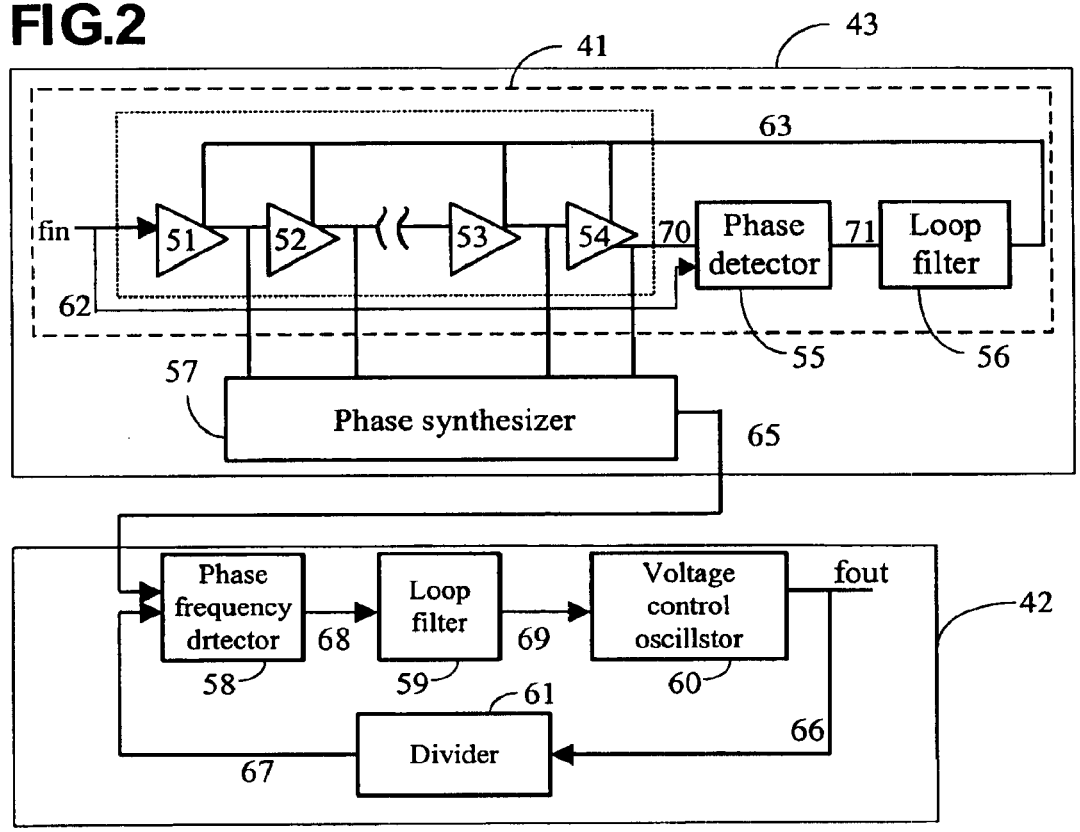
FIG. 2 shows a circuit diagram of a frequency synthesizing circuit according to the present invention.

Please refer to FIG. 2, which illustrates a frequency synthesizing circuit according to the present invention. The frequency synthesizing circuit mainly includes a frequency multiplier 43 and a phase-locked loop 42, wherein the frequency multiplier 43 converts a low frequency reference input signal $f_{in}$ 62 into a high frequency output 65 for being provided as a reference to the phase-locked loop 42. A phase frequency detector (PFD) 58 compares the reference signal 65 with an output signal 67 to obtain phase and frequency difference and generates a modulated signal 68. Then, the modulated signal 68 is converted into a substantial DC voltage 69 by a loop filter 59 for further modulating a frequency of a voltage control oscillator 60.

An output signal 66 of the voltage controlled oscillator 60 can be downconverted by a divider 61, wherein the downconverted signal 67 outputted by a divider is connected to the phase frequency detector 58.

Figure 3:
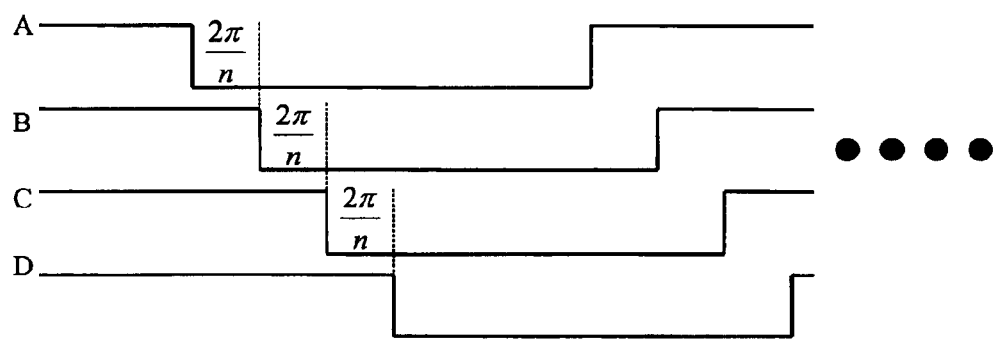
FIG. 3 shows a diagram of a multiphase output signals that evenly divide a cycle.

The frequency multiplier 43 according to the present invention includes a delay-locked loop and a phase synthesizer. The delay-locked loop is comprised of delay circuit 51–54, a phase detector (PD) 55 and a loop filter 56, wherein the delay circuit 51–54 is formed by "n" delay elements (herein the delay circuit is formed by the delay elements 51–54), the delay elements can be any circuit which can modulate the delay time, and the delay time is controlled by the control signal 63. An input of the reference signal 62 can be converted into signals with different phases and identical frequency to thereof at the output terminal of the delay circuit after passing through a series of delay elements. The phase detector 55 can detect the phase difference between an output phase 70 of the last delay element and the input reference signal 62 so as to generate a modulated signal 71. Then, the modulated signal 71 can control the delay time of the delay circuit through the control signal 63 which is converted into a substantial voltage by the loop filter 56. When the delay-locked loop is phase locked, a multiphase output signal at the delay circuit 51–54 can be obtained, wherein the multiphase output signal divides a cycle and makes an output phase of each delay element to have a phase difference of $$\frac{2\pi}{n},$$

as shown in FIG. 3.

Figure 4:
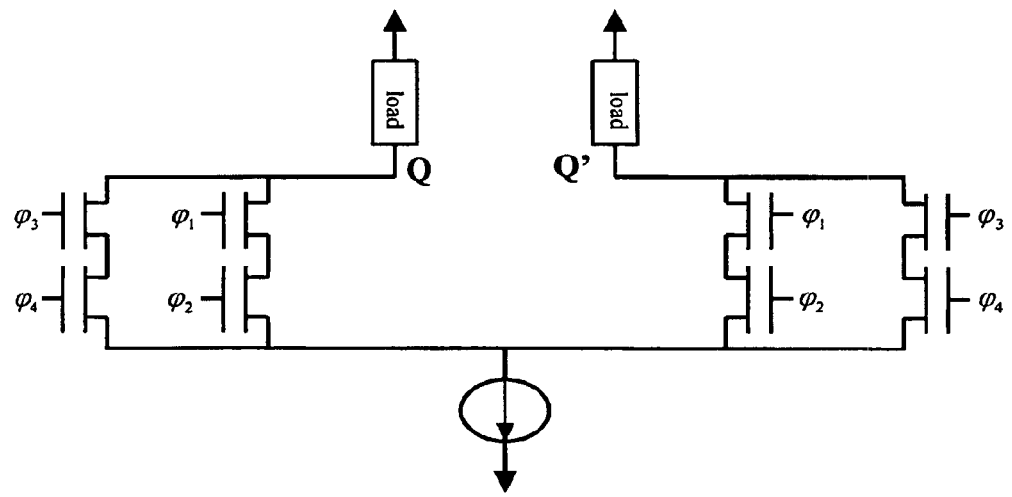
FIG. 4 shows a circuit diagram generating a doubling frequency output, which is synthesized by four phases output signals that equivalently divides a cycle.

Please refer to FIG. 4, which illustrates a basic framework of frequency doubling phase synthesizer. As shown in FIG. 4, φ1, φ2, φ3 and φ4 are four phases which evenly divide a cycle and are generated by the delay-locked loop, and the phase difference thereamong is:

$$\Delta\theta = 2\pi/4 = \pi/2$$

Figure 5:
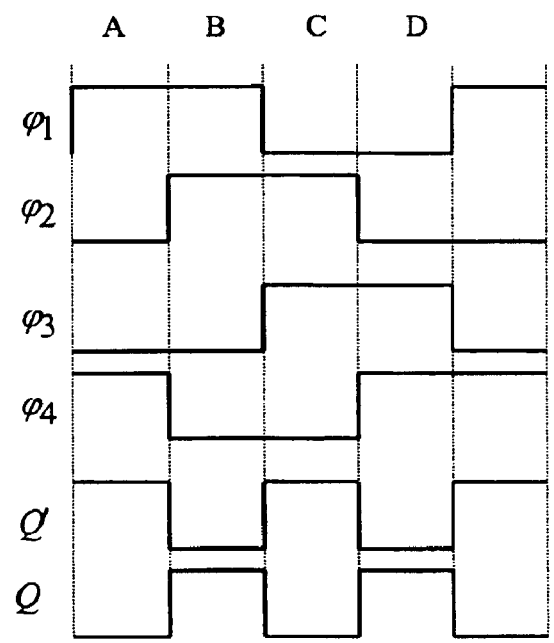
FIG. 5 shows a signal diagram generating a doubling frequency output, which is synthesized by four phases signals that equivalently divides a cycle.

After a mix of the four phase signals, a frequency doubling signal can be obtained at the output terminals Q and Q'. A simple analysis is described as follows (please refer to FIG. 5):

$$\varphi 1(\text{High}) = (0 \leq \theta \leq \pi) = (0 \leq \theta \leq \pi)$$

$$\varphi 2(\text{High}) = (\pi/2 \leq \theta \leq 3\pi/2) = (\Delta\theta \leq \theta \leq \pi + \Delta\theta)$$

$$\varphi 3(\text{High}) = (\pi \leq \theta \leq 2\pi) = (2\Delta\theta \leq \theta \leq \pi + 2\Delta\theta)$$

$$\varphi 4(\text{High}) = (3\pi/2 \leq \theta \leq 5\pi/2) = (3\Delta\theta \leq \theta \leq \pi + 3\Delta\theta)$$

$$Q(\text{High}) = (\Delta\theta \leq \theta \leq 2\Delta\theta) \cup (3\Delta\theta \leq \theta \leq 4\Delta\theta)$$

$$= (\pi/2 \leq \theta \leq \pi) \cup (3\pi/2 \leq \theta \leq 2\pi)$$

$$= \varphi 1 \times \varphi 2 + \varphi 3 \times \varphi 4$$

$$Q'(\text{High}) = (0 \leq \theta \leq \Delta\theta) \cup (2\Delta\theta \leq \theta \leq 3\Delta\theta)$$

$$= (\theta \leq \theta \leq \pi/2) \cup (\pi \leq \theta \leq 3\pi/2)$$

$$= \varphi 1 \times \varphi 4 + \varphi 2 \times \varphi 3$$

A frequency doubler accomplished by phase synthesizing can be obtained to implement the Boolean function of Q and Q'.

According to this concept, through utilizing n phases output signals (n is even) which equivalently divide a cycle and have a phase difference of $$\Delta\theta = \frac{2\pi}{n},$$

an output result with a $$\frac{n}{2} -$$

frequency multiplication can be obtained by a phase synthesizing. The general formula of the differential output is:

$$Q(\text{High}) = (\Delta\theta \leq \theta \leq 2\Delta\theta) \cup (3\Delta\theta \leq \theta \leq 4\Delta\theta) \cup$$

$$(\Delta 5\theta \leq \theta \leq 6\Delta\theta) \cup \ldots \cup ((n-1)\theta \leq \theta \leq n\Delta\theta)$$

$$= \varphi 1 \times \varphi 2 + \varphi 3 \times \varphi 4 + \varphi 5 \times \varphi 6 + \ldots + \varphi(n-1) \times \varphi n$$

$$Q'(\text{High}) = (\theta \leq \theta \leq \Delta\theta) \cup (2\Delta\theta \leq \theta \leq 3\Delta\theta) \cup$$

$$(\Delta 5\theta \leq \theta \leq 6\Delta\theta) \cup \ldots \cup ((n-1)\theta \leq \theta \leq n\Delta\theta)$$

$$= \varphi n \times \varphi 1 + \varphi 2 \times \varphi 3 + \varphi 4 \times \varphi 5 + \ldots + \varphi(n-2) \times \varphi(n-1)$$

According to this formula, the frequency doubling concept can be extended. Assuming that it has n phases reference signals which divide a cycle ($n=2^M$), through synthesizing at different phases, different frequency multiplying output signals $2^{M-1}$, $2^{M-2}$, ..., $2^1$ can be generated.

Wherein a frequency $2^{M-1}$-multiplying output signal has a general formula of:

$$Q(\text{High}) = \phi 1 \times \phi 2 + \phi 3 \times \phi 4 + \phi 5 \times \phi 6 + \ldots + \phi(n-1) \times \phi n$$

total $2^{M-1}$ items $$Q'(\text{High}) = \phi n \times \phi 1 + \phi 2 \times \phi 3 + \phi 4 \times \phi 5 + \ldots + \phi(n-2) \times \phi(n-1)$$

total $2^{M-1}$ items

A frequency $2^{M-2}$-multiplying output signal has a general formula of:

$$Q(\text{High}) = \phi 1 \times \phi 3 + \phi 5 \times \phi 7 + \phi 9 \times \phi 11 + \circ \circ + \phi(n-3) \times \phi(n-1)$$

total $2^{M-2}$ items $$Q'(\text{High}) = \phi(n-1) \times \phi 1 + \phi 3 \times \phi 5 + \phi 7 \times \phi 9 + \circ \circ + \phi(n-5) \times \phi(n-1)$$

total $2^{M-2}$ items

A frequency $2^1 = 2^{[M-(M-1)]}$ multiplying output signal has a general formula of:

$$Q'(\text{High}) = \phi 1 \times \phi(1+M-1) + \phi(M+M-1) \times \phi(2M-1+M-1)$$

total $2^1$ items $$Q'(\text{High}) = \phi(n-M+2) \times \phi 1 + \phi(1+M-1) \times \phi(M+M-1)$$

total $2^1$ items

Figure 6:
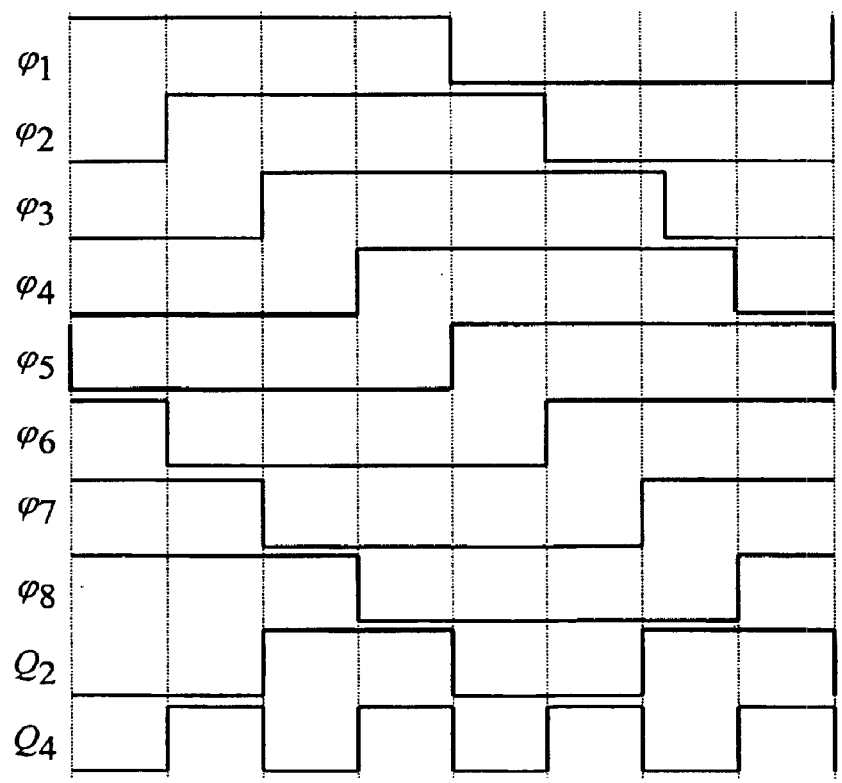
FIG. 6 shows a signal diagram of a doubling frequency Q2 and a quadrupling frequency Q4, which are respectively synthesized by eight phases signals that equivalently divides a cycle.

Please refer to FIG. 6, which illustrates an output signal analyzing result of a doubling frequency Q2 and a quadrupling frequency Q4 which are synthesized by eight phases signals that equivalently divide a cycle.

Figure 7:
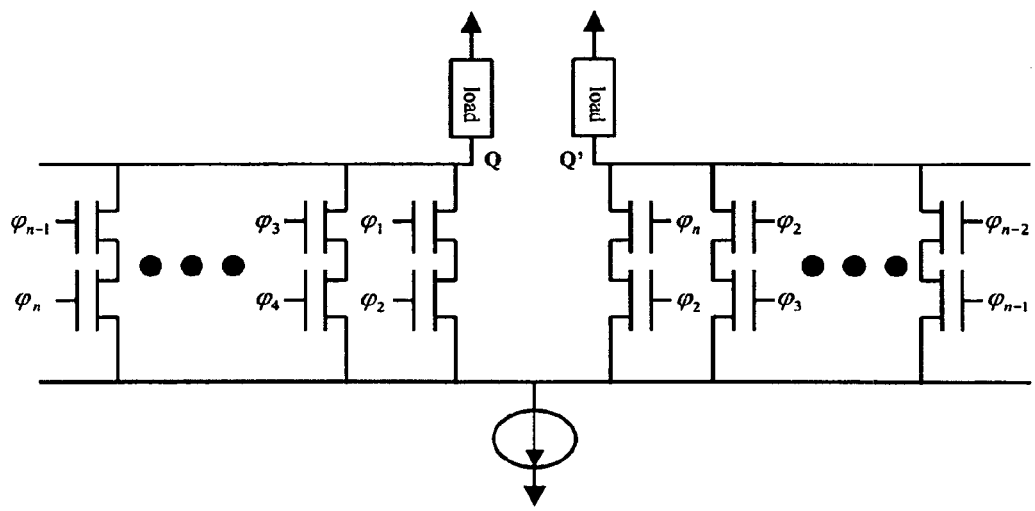
FIG. 7 shows a framework of a $$\frac{n}{2} -$$

FIG. 7 illustrates a framework of a $$\frac{n}{2} -$$

multiplying phase synthesizer which is synthesized by n phases signals that equivalently divide a cycle.

Figure 8:
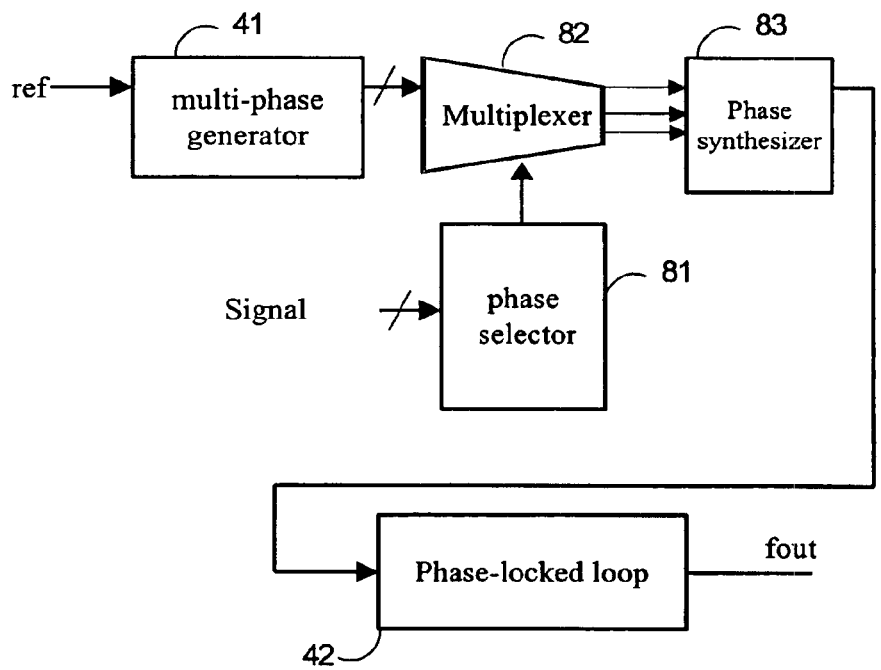
FIG. 8 shows a framework of a programmable frequency synthesizing circuit.

Please refer to FIG. 8. A programmable frequency synthesizer includes a multi-phase generator 41, a phase selector 81, a multiplexer 82, a phase synthesizer 83 and a phase-locked loop 42, wherein the multi-phase generator 41 generates multiphase outputs that equivalently divide a cycle of a reference signal, which can be selectively outputted by the multiplexer 82 according to the phase selector 81. The phase synthesizer combines output phases from multiplexer so as to achieve frequency multiplication. Moreover, the output of the phase synthesizer can be employed as a reference signal of the phase-locked loop 42. The phase selector 81 processes the phase addressing according to an external frequency multiplying control signal and then output a selected phase through the multiplexer. Take FIG. 6 as an example, an eight phases reference signal can respectively achieve a frequency doubling output and a frequency quadrupling output through synthesizing different phases.

The frequency synthesizing circuit according to the present invention, when being compared with the other prior arts, further includes the advantages as follows:

1. The present invention provides a frequency synthesizing circuit which utilizes double frequency multiplying functions by a phase-locked loop and a delay loop to mitigate phase error accumulation which may occur in the conventional phase-locked loop with only single frequency multiplying and narrow loop bandwidth.

2. The present invention provides a frequency synthesizing circuit which can be applied in any programmable frequency synthesizer. Furthermore, it can provide a good efficiency for being applied in a frequency synthesizer having a low frequency reference signal and a high frequency output.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modification and equivalent arrangements.

What is claimed is:

1. A frequency synthesizing circuit comprising a frequency multiplier and a phase-locked loop, wherein an external reference signal which is frequency doubled by said frequency multiplier is employed to be a reference signal of said phase-locked loop for increasing the load bandwidth of said phase-locked loop said frequency multiplying circuit comprises a delay phase-locked loop and a phase synthesizer, said delay phase-locked loop is utilized to generate multiphase outputs which equivalently divide a cycle of said reference signal, and said phase synthesizer utilizes said multiphase output to synthesize an equivalent frequency multiplying signal.

2. A frequency synthesizing circuit comprising a multiphase generator, a multiplexer, a phase selector and a phase-locked loop, wherein frequency multiplication is achieved by synthesizing different output phases generated from said multiphase generator whose phases are selected outputted to the phase synthesizer by said multiplexer incorporated with a phase selector and the output of said phase synthesizer is employed to be a reference signal of said phase-locked loop.

3. The frequency synthesizing circuit according to claim 2, wherein said multiphase generator comprises a delay phase-locked loop which generate said multiphase outputs that equivalently divide a cycle of said reference signal and is cooperated with said phase selector and said multiplexer to be outputted to said phase synthesizer so as to synthesize different frequency multiplying signals through said phase synthesizer.

* * * * *